United States Patent
Schmitt et al.

(10) Patent No.: US 8,108,198 B2
(45) Date of Patent: Jan. 31, 2012

(54) MEMORY TRACING IN AN EMULATION ENVIRONMENT

(75) Inventors: Peer Schmitt, Paris (FR); Philippe Diehl, Versailles (FR); Charles Selvidge, Waltham, MA (US); Cyril Quennesson, Antony (FR)

(73) Assignee: Mentor Graphics Corporation, Wilsonville, OR (US)

( * ) Notice: Subject to any disclaimer, the term of this patent is extended or adjusted under 35 U.S.C. 154(b) by 481 days.

(21) Appl. No.: 12/094,392

(22) PCT Filed: Feb. 21, 2007

(86) PCT No.: PCT/EP2007/051644
§ 371 (c)(1),
(2), (4) Date: May 20, 2008

(87) PCT Pub. No.: WO2007/096372
PCT Pub. Date: Aug. 30, 2007

(65) Prior Publication Data
US 2008/0288719 A1    Nov. 20, 2008

Related U.S. Application Data

(60) Provisional application No. 60/775,494, filed on Feb. 21, 2006.

(51) Int. Cl.
G06F 9/445 (2006.01)
G06F 3/00 (2006.01)
(52) U.S. Cl. ............. 703/22; 703/24; 703/27; 711/134; 714/29; 714/38; 717/134
(58) Field of Classification Search .................... 703/22, 703/24, 27; 714/38, 29, 45; 717/134; 711/134
See application file for complete search history.

(56) References Cited

U.S. PATENT DOCUMENTS

| 4,636,945 A | 1/1987 | Tanagawa et al. |
| 4,674,089 A | 6/1987 | Poret et al. |

(Continued)

FOREIGN PATENT DOCUMENTS

EP    1 450 278    8/2004

(Continued)

OTHER PUBLICATIONS

International Preliminary Report on Patentability for PCT/EP2007/051644, 1 page, Sep. 4, 2008.

(Continued)

*Primary Examiner* — Thai Phan

(57) ABSTRACT

A system and method are disclosed to trace memory in a hardware emulator. In one aspect, a first Random Access Memory is used to store data associated with a user design during emulation. At any desired point in time, the contents of the first Random Access Memory are captured in a second Random Access Memory. After the capturing, the contents of the second Random Access Memory are copied to a visibility system. During the copying, the user design may modify the data in the first Random Access Memory while the captured contents within the second Random Access Memory remain unmodifiable so that the captured contents are not compromised. In another aspect, different size memories are in the emulator to emulate the user model. Larger memories have their ports monitored to reconstruct the contents of the memories, while smaller memories are captured in a snapshot RAM. Together the two different modes of tracing memory are used to provide visibility to the user of the entire user memory.

20 Claims, 10 Drawing Sheets

U.S. PATENT DOCUMENTS

| | | | |
|---|---|---|---|
| 4,879,646 A | 11/1989 | Iwasaki et al. | |
| 4,954,942 A | 9/1990 | Masuda et al. | |
| 5,036,473 A | 7/1991 | Butts et al. | |
| 5,109,353 A | 4/1992 | Sample et al. | |
| 5,321,828 A | 6/1994 | Phillips et al. | |
| 5,345,580 A | 9/1994 | Tamaru et al. | |
| 5,444,859 A | 8/1995 | Baker et al. | |
| 5,560,036 A | 9/1996 | Yoshida | |
| 5,564,041 A | 10/1996 | Matsui et al. | |
| 5,608,867 A | 3/1997 | Ishihara | |
| 5,754,827 A | 5/1998 | Barbier et al. | |
| 6,041,406 A * | 3/2000 | Mann | 712/227 |
| 6,061,511 A | 5/2000 | Marantz et al. | |
| 6,243,836 B1 * | 6/2001 | Whalen | 714/45 |
| 6,314,530 B1 * | 11/2001 | Mann | 714/38 |
| 6,549,959 B1 * | 4/2003 | Yates et al. | 710/22 |
| 6,721,922 B1 * | 4/2004 | Walters et al. | 716/1 |
| 7,826,282 B2 * | 11/2010 | Schmitt | 365/189.17 |
| 2001/0054175 A1 | 12/2001 | Watanabe | |
| 2002/0162055 A1 | 10/2002 | Kurooka | |
| 2004/0015885 A1 * | 1/2004 | Akatsuka | 717/134 |
| 2004/0148153 A1 * | 7/2004 | Beletsky et al. | 703/27 |
| 2005/0102572 A1 * | 5/2005 | Oberlaender | 714/29 |
| 2008/0288719 A1 * | 11/2008 | Schmitt et al. | 711/104 |
| 2008/0301360 A1 * | 12/2008 | Schmitt | 711/104 |

FOREIGN PATENT DOCUMENTS

| | | |
|---|---|---|
| EP | 1450278 | 8/2004 |
| JP | 09 252309 | 9/1997 |

OTHER PUBLICATIONS

Written Opinion of the International Searching Authority for PCT/EP2007/051644, 5 pp., Sep. 4, 2008.

Anticoli, International Search Report for PCT/EP2007/051644, Apr. 17, 2007.

\* cited by examiner

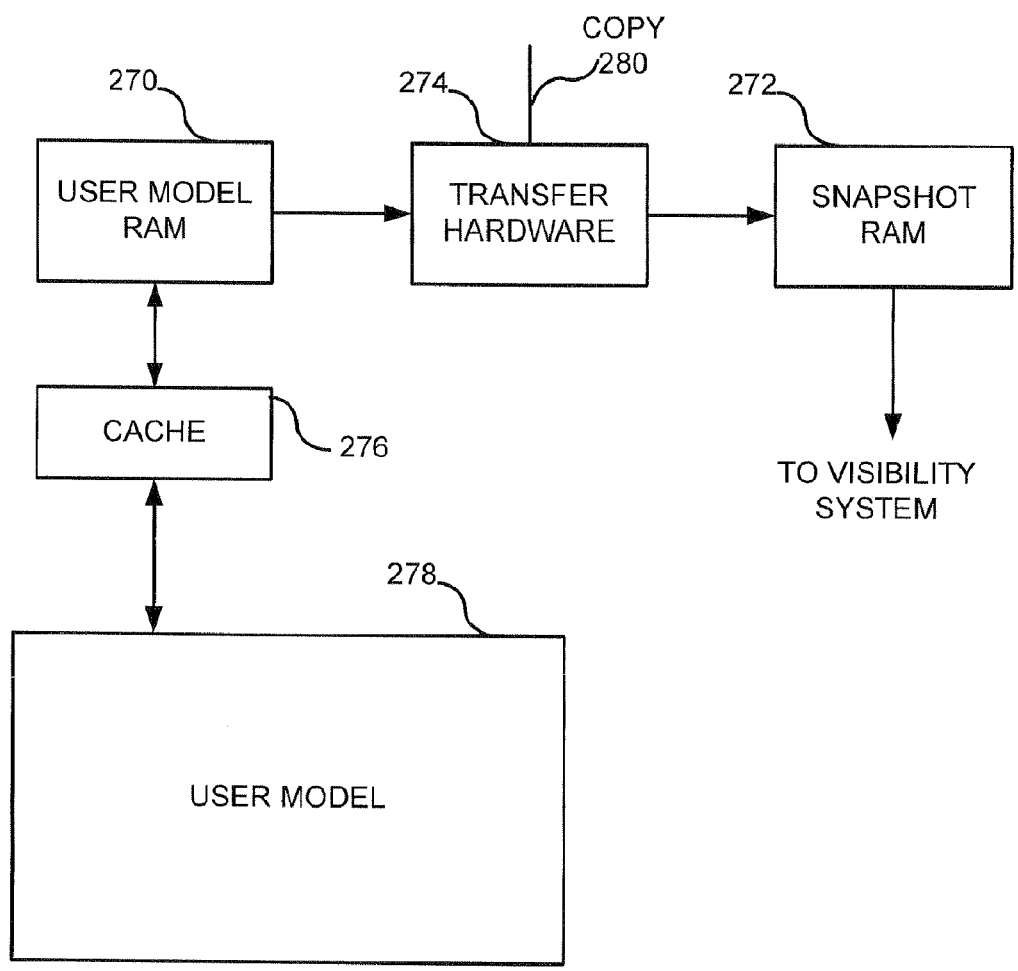

MEMORY TRACING IN AN EMULATION ENVIRONMENT

CROSS REFERENCE TO RELATED APPLICATIONS

This is a 35 U.S.C. §371 U.S. National Stage of International Application No. PCT/EP2007/051644, filed Feb. 21, 2007, which was published in English under PCT Article 21(2), which in turn claims the benefit of U.S. Provisional Application No. 60/775,494, filed Feb. 21, 2006. Both applications are incorporated herein in their entirety.

RELATED APPLICATION DATA

This application claims priority to U.S. provisional application 60/775,494 dated Feb. 21, 2006, entitled "Memory Snapshot in an Emulation Environment", the contents of which are hereby incorporated by reference.

FIELD OF THE INVENTION

The present invention generally relates to hardware emulators, and more particularly to tracing memories in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Once the design is loaded and running in the hardware emulator, it is desirable to obtain trace data of the states of the various design state elements and/or other design elements and/or design signals. Such trace data, also known as user visibility data, is made available to the user and is often used to debug a design. Unfortunately, as the number of state elements increases, so to does the amount of trace data. For example, an FPGA emulating one hundred thousand state elements could generate up to one hundred thousand bits, or 0.1 Mb, of trace data per clock cycle. The elements that are traced can be divided into three main categories: flip-flops, glue logic, and RAM. Each of these categories has its own unique tracing problems, but all are limited by the size of a trace buffer into which data is stored. Because of the large amount of data needed to be captured over a large number of clock cycles, some elements are captured only at pre-determined intervals (e.g., every 1000 clock cycles) and if a user requests to view a particular interval, any uncaptured cycles can be simulated and regenerated in order to complete the entire trace period. For example, flip-flops may be captured once every 1000 cycles and that captured data may be used to simulate the other flip-flop states as well as the glue logic.

While such simulation works well with flip-flops and glue logic, memory must be captured every clock cycle. For example, a user wanting to view the contents of memory at a particular trace cycle cannot rely on simulation generated using a memory captured only once every 1000 cycles. If the memory contents change every cycle, such changes will be lost and unrecoverable. Another difficult issue with memory is the manner of tracing used. During emulation, the memory is constantly accessed. In order to view the memory, it is not possible to switch off the memory or the emulator and download the memory contents. Thus, current systems monitor the memory ports in order to trace changes that occurred in the memory, similar to shadow memories known in the art. Knowledge of the original contents of memory and how it changed can be used to accurately recreate the memory contents.

A problem with tracing read ports is that every user cycle, memory data continuously accumulates until a cross-over point where the data captured to duplicate the memory exceeds the memory size itself. Continued tracing beyond the cross-over point means that it would have been more efficient to have a duplicate memory. Additionally, as user designs continue to become larger and more complex, the memory size is increasing, requiring the trace buffer to monitor more memory ports. With this trend continuing, it is desirable to re-think how memory can be more efficiently traced without over-burdening the trace system.

SUMMARY

A system and method are disclosed to trace memory in a hardware emulator.

In one aspect, a first Random Access Memory is used to store data associated with a user design during emulation. At any desired point in time, the contents of the first Random Access Memory are captured in a second Random Access Memory. After the capturing, the contents of the second Random Access Memory are copied to another location. During the copying, the user design may modify the data in the first Random Access Memory while the captured contents within the second Random Access Memory remain unmodifiable so that the captured contents are not compromised.

In another aspect, different size memories within the emulator are used to emulate the user model. Larger memories have their ports monitored to reconstruct the contents of the memories, while smaller memories are captured in a snapshot RAM. Together the two different modes of tracing memory are used to provide visibility to the user of the entire user memory.

These features and others of the described embodiments will be more readily apparent from the following detailed description, which proceeds with reference to the accompanying drawings.

BRIEF DESCRIPTION OF THE DRAWINGS

FIG. 10 is another embodiment showing the user memory and the snapshot memory.

DETAILED DESCRIPTION

Figure 1:
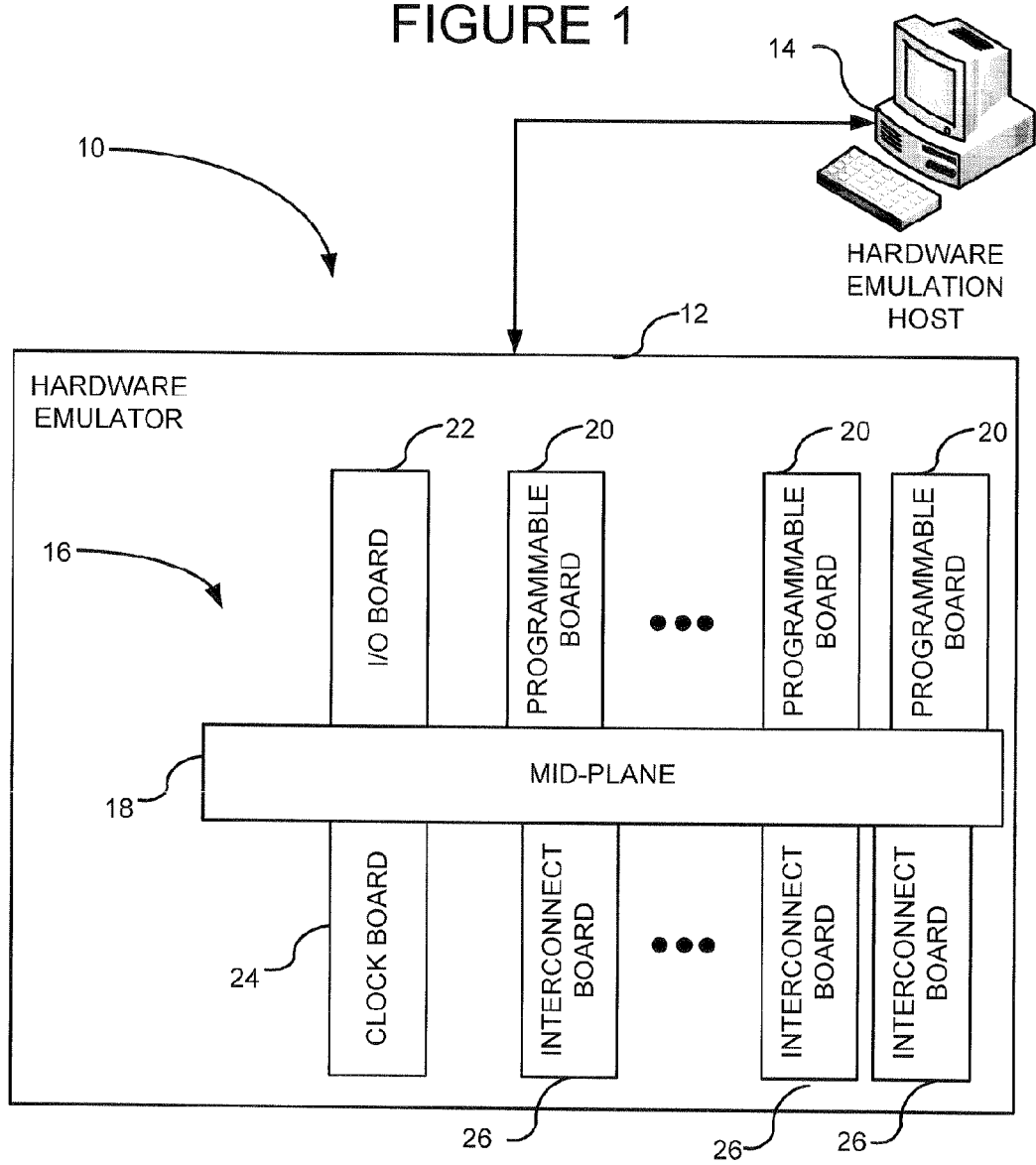
FIG. 1 is a system diagram of a hardware emulator environment.

FIG. 1 shows an emulator environment 10 including a hardware emulator 12 coupled to a hardware emulator host 14. The emulator host 14 may be any desired type of computer hardware and generally includes a user interface through which a user can load, compile and download a design to the emulator 12 for emulation. The user can also view the trace results of a visibility system through the host 14, as described further below.

The emulator 12 includes multiple printed circuit boards 16 coupled to a midplane 18. The midplane 18 allows physical connection of the printed circuit boards into the emulator 12 on both sides of the midplane. A backplane may also be used in place of the midplane, the backplane allowing connection of printed circuit boards on one side of the backplane. Any desired type of printed circuit boards may be used. For example, programmable boards 20 generally include an array of FPGAs, or other programmable circuitry, that may be programmed with the user's design downloaded from the emulator host 14. One or more I/O boards 22 allow communication between the emulator 12 and hardware external to the emulator. For example, the user may have a preexisting processor board that is used in conjunction with the emulator and such a processor board connects to the emulator through I/O board 22. Clock board 24 generates any number of desired clock signals. And interconnect boards 26 allow integrated circuits on the programmable boards 20 to communicate together and with integrated circuits on the I/O boards 22.

Figure 2:
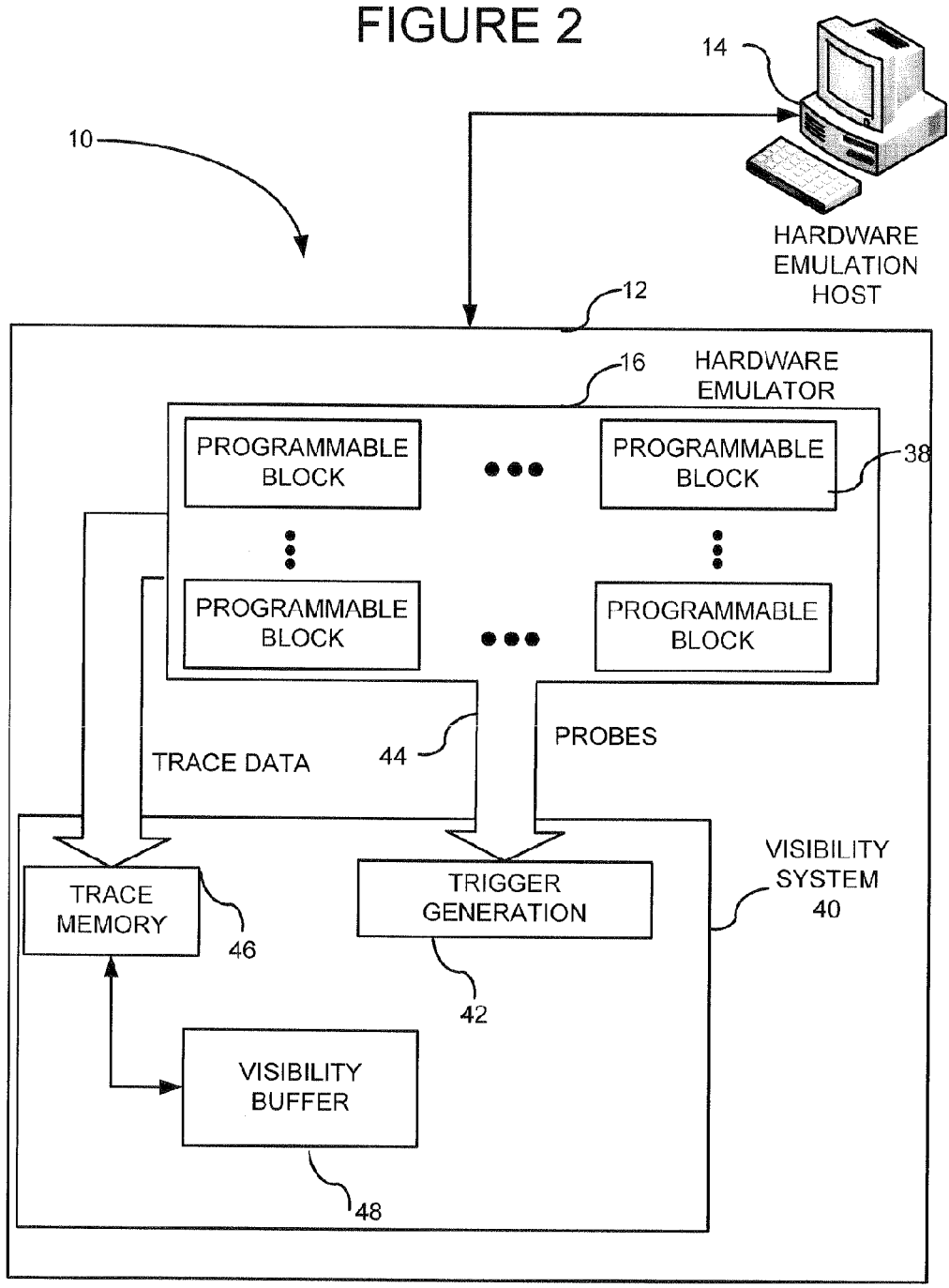
FIG. 2 shows details of a visibility system in the hardware emulator of FIG. 1.

FIG. 2 shows further details of one of the printed circuit boards 16 and the interaction with a visibility system 40. The visibility system allows a user to set certain events or triggers 42 detected through probes 44 coupled to programmable blocks 38 on the printed circuit board 16. If a trigger is activated, data related to the board's operation is stored in a trace memory 46. A visibility buffer 48 is coupled to the trace memory and is used by software on the emulation host 14 to display the trace results to the user.

Figure 3:
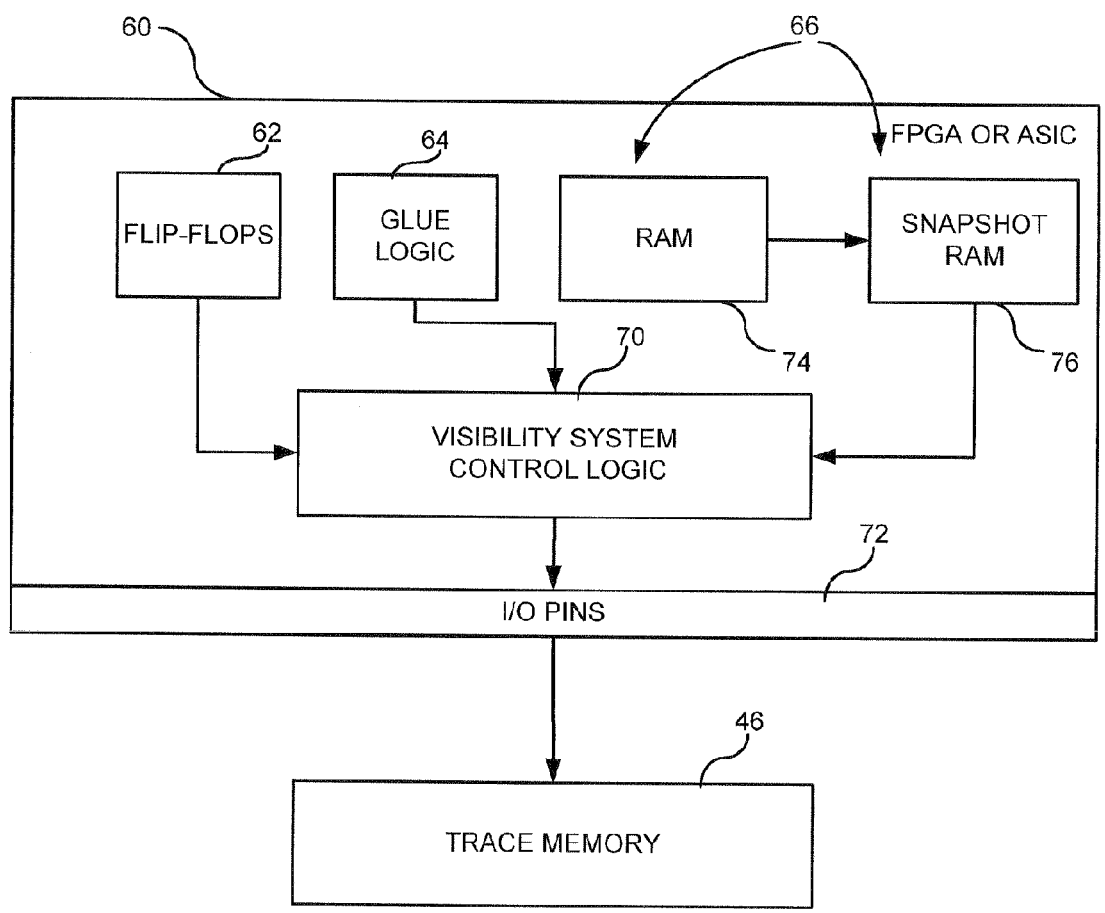
FIG. 3 shows a hardware diagram of an FPGA or ASIC located on a printed circuit board within the hardware emulator.

FIG. 3 shows further details of a portion of a programmable block that, in this case, is an FPGA 60 (an ASIC may also be used in place of the FPGA). The FPGA is an integrated circuit within an IC package of any desired type. In order to implement a user design within an emulator, the FPGA can be thought of as having three groups of digital logic: flip-flops 62, glue logic 64, and RAM 66. In order to trace events that occur within the digital logic, a visibility system control logic block 70 (that is part of the visibility system 40) receives inputs from flip-flops 62, glue logic 64 and the memory 66. The visibility block 70 then passes this information regarding state through I/O pins 72 on the IC package to the trace memory 46.

The RAM 66 in FIG. 3 includes two separate types of RAM: a standard RAM 74, which is used by the user model to emulate the user's design, and a snapshot RAM 76, which is used to capture the contents of RAM 74 at any desired moment in time. Rather than monitor the ports of RAM 74 directly, the visibility system control logic 70 receives information regarding the contents of RAM 74 via the snapshot RAM 76. As described further below, the snapshot RAM takes an instantaneous picture of the contents of RAM by making a duplicate copy thereof. The control logic transmits the contents received from the snapshot RAM 76 to the trace memory 46 via the I/O pins 72. By not monitoring the ports of RAM 74 directly on every clock cycle, the bandwidth of the visibility system control logic 70 is increased. Instead, the instantaneous content of the RAM 74 can be captured in the snapshot RAM 76 and downloaded to the visibility system control logic over many clock cycles.

Figure 4:
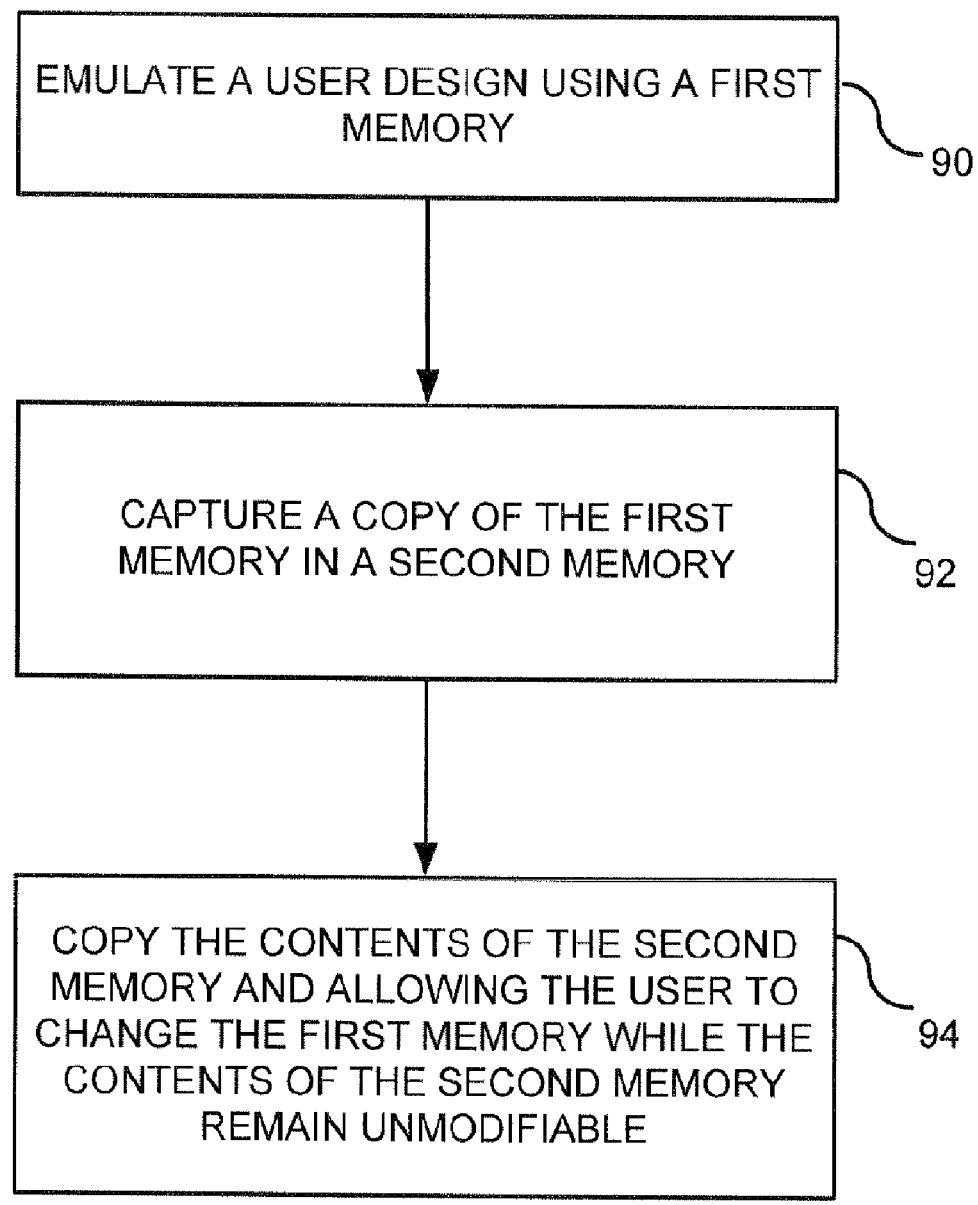
FIG. 4 is a flowchart of a method for capturing the contents of a memory within the emulator environment, without disturbing the emulation.

FIG. 4 shows a flowchart of a method for illustrating how the contents of the RAM 74 can be displayed to the user. In process block 90, a first memory is used to emulate the user design. For example, RAM 74 in FIG. 3 may be used to emulate the user design. In process block 92, a copy of the first memory is captured in a second memory. The copy captured is an instantaneous copy, such that the content of the first memory is locked or cannot be changed until the copy to the second memory is complete. In process 94, the contents of the second memory are downloaded to the visibility system in order to display the contents of the first memory to the user. During the downloading of the contents of the second memory, the first memory may be modified so emulation is not effected. However, the second memory remains unmodifiable so that the instantaneous snapshot of the first memory contents is not compromised.

Figure 5:
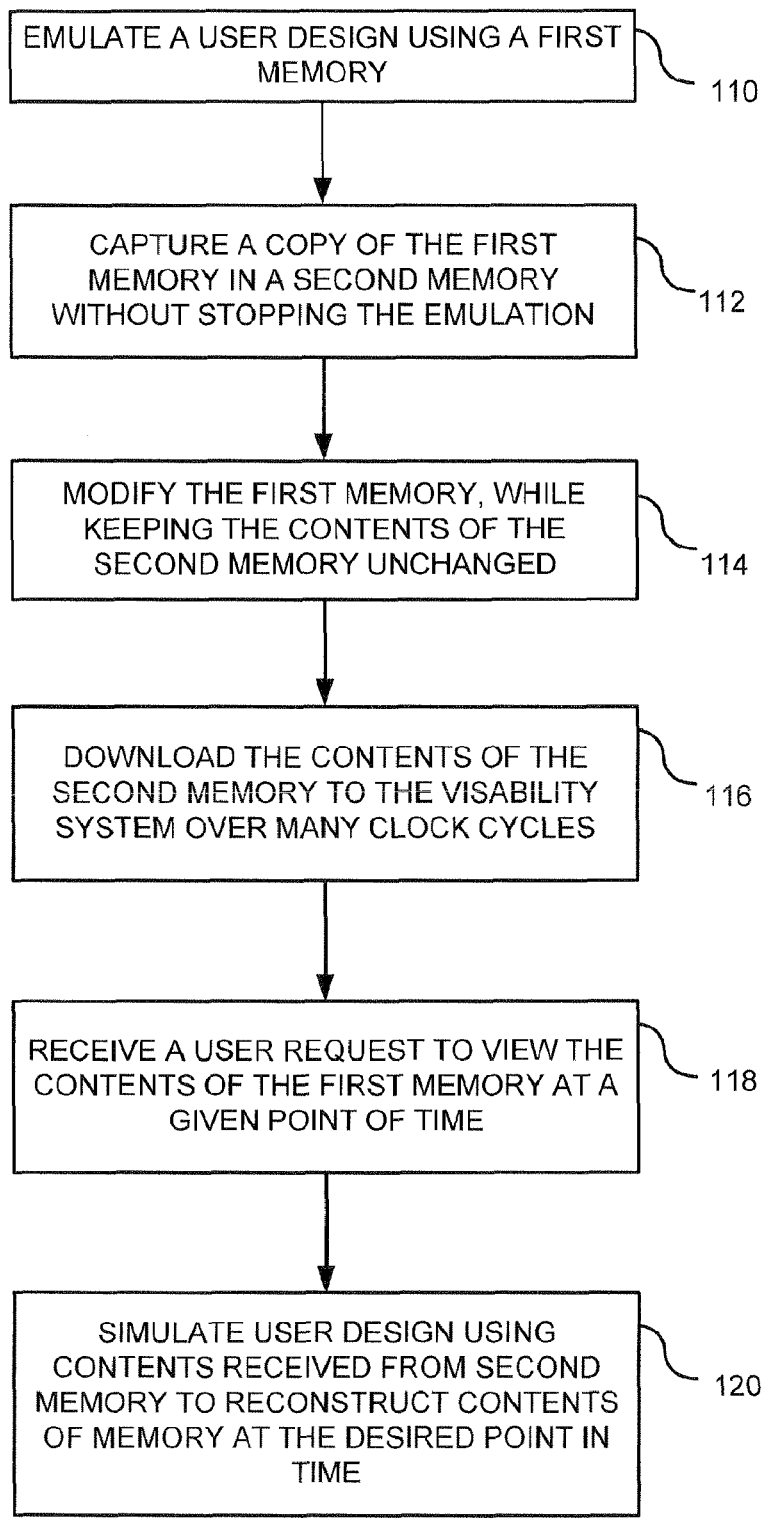
FIG. 5 is a more detailed flowchart of a method for viewing the contents of the memory within the emulator.

FIG. 5 shows a more detailed flowchart of a method for providing visibility to a user. In process block 110, a first memory is used to emulate a user design. Thus, the user design requires a memory, such as RAM that can be written to and read from. In process block 112, the entire contents of the first memory are captured in a second memory without stopping the emulation. The user model does not have access to the second memory. Instead, the second memory is only available to make an instantaneous copy of the first memory. While the first memory is being captured, the contents of the first memory cannot be changed. In some embodiments described below, it is possible to copy the first memory in one emulator clock cycle so that the user model does not have time to change the first memory before the copy is completed. In other embodiments, it is desirable to lock the first memory or cache the desired changes until the entire copy is made. After the second memory has captured the contents of the first memory, the first memory may be modified by the user model. However, as indicated in process block 114, the second memory maintains the captured contents and is not modified. In process block 116, the contents of the second memory are downloaded over many clock cycles to the visibility system. Thus, the visibility system is not overburdened by continuously monitoring the first memory, but instead can receive the snapshot of the first memory over any desired period of time. In process block 118, a user may request, via the emulation host 14, to view the contents of the first memory at a point in time decided by the user. In process block 120, the user design is simulated using multiple snapshots of the first memory acquired during the emulation to reconstruct contents of the memory at the point in time decided by the user.

Figure 6:
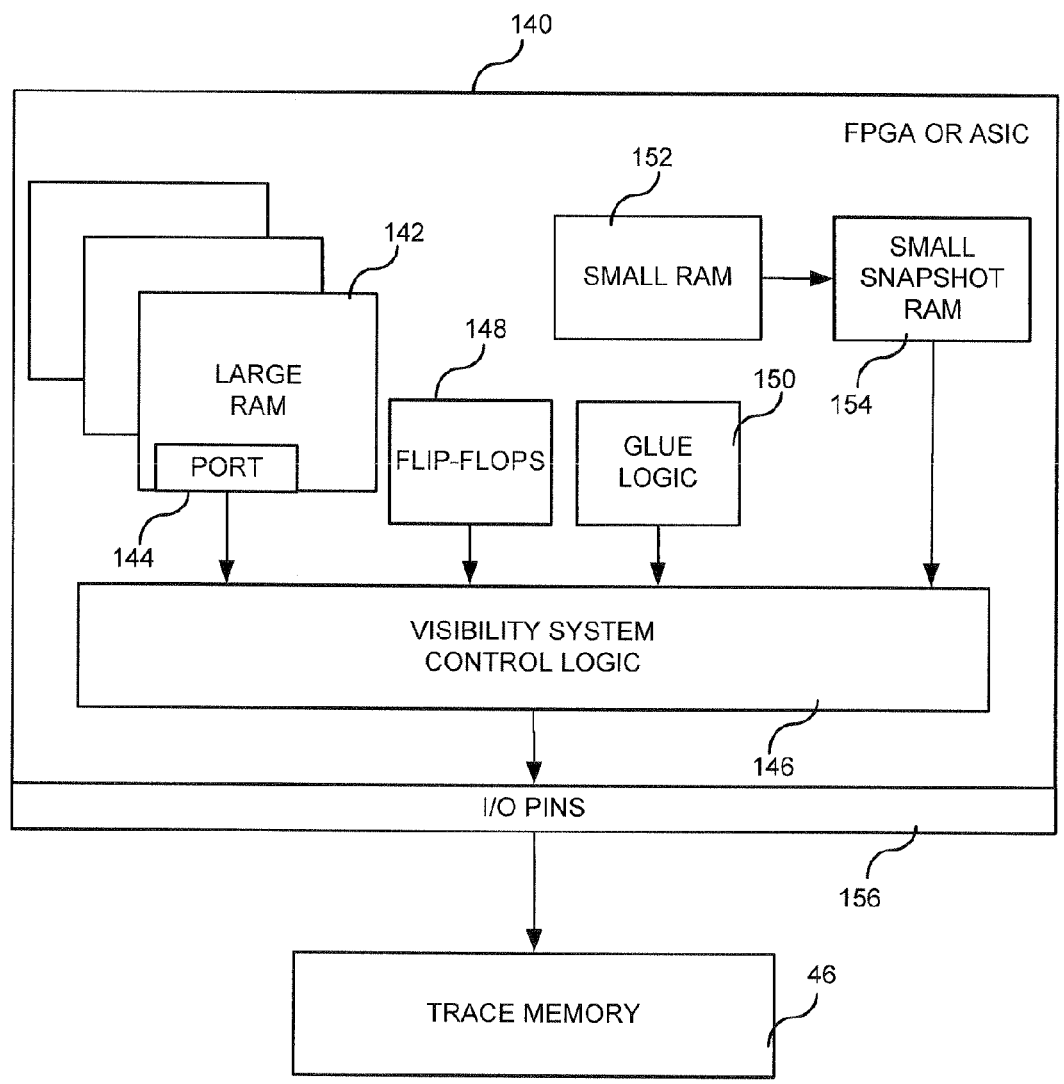
FIG. 6 is a hardware diagram showing an FPGA or ASIC located on a printed circuit board within the hardware emulator with a visibility system monitoring the ports of some memories and using a snapshot memory for tracing other memories.

FIG. 6 shows another hardware embodiment wherein two different size memories within the same FPGA or ASIC 140 are used by the user model. A group of memories 142 is used by the user model as RAM. Any size RAM may be used (e.g., 512K) depending on the application. The group of memories 142 include ports 144 that are monitored by a visibility control system 146, which is part of the visibility system 40. Flip-flops 148 and glue logic 150 are also within the IC 140 as already described. A second memory (or group of memories) 152 is smaller (e.g., 4K) than the memories 142. This second memory 152 has a port (not shown) that is not monitored by the visibility system. Instead, the visibility system receives information regarding the second memory 152 through a snapshot memory 154. And rather than monitoring the port of the snapshot memory 154, the contents thereof are directly downloaded to the visibility system control logic 146. Thus, two different size RAMs are present in the same IC and are accessible from the user model. However, there are two different techniques for monitoring the memories. The first group of memories 142 is monitored through their ports 144, while the second memory 152 is monitored through the snapshot memory 154. Once all the data is captured by the visibility system control logic 146, it is passed to the trace memory 46 via the I/O pins 156.

Figure 7:
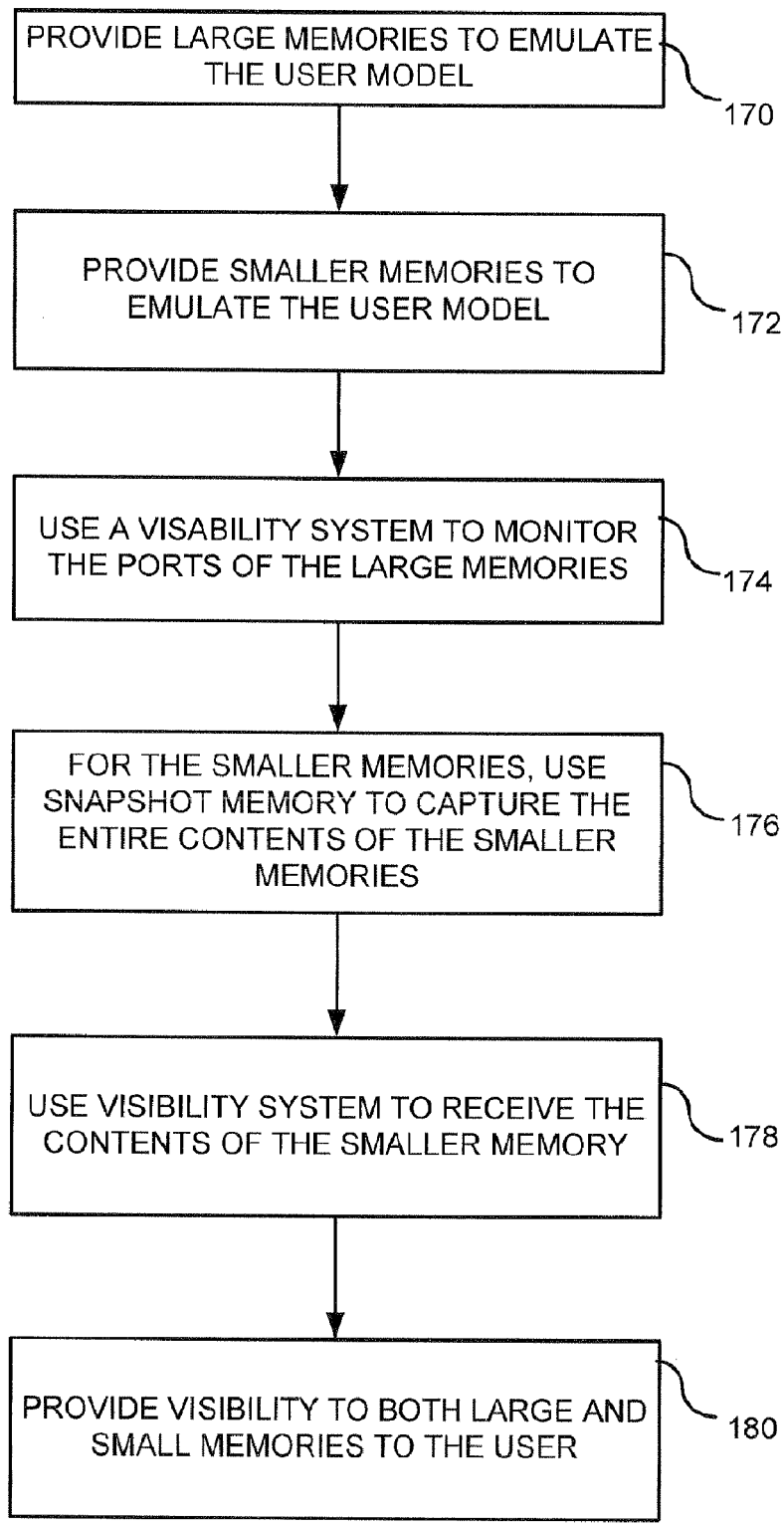
FIG. 7 is a flowchart of a method for providing visibility to users of both large and small memories.

FIG. 7 shows a flowchart of a method for tracing the memories in the system of FIG. 6. In process block 170, large memories are used to emulate the user model. At the same time, smaller memories (e.g., 50-200 times smaller) are used to emulate the user model (process block 172). In process block 174, the visibility system monitors the ports of the large memories in order to trace the memory contents. In process block 176, instead of monitoring ports, one or more snapshot memories are used to capture the contents of the smaller memories. In process block 178, the visibility system receives the contents of the smaller memories through the snapshot memories. In process block 180, visibility of both the large and small memories is seamlessly provided to the user.

Figure 8:
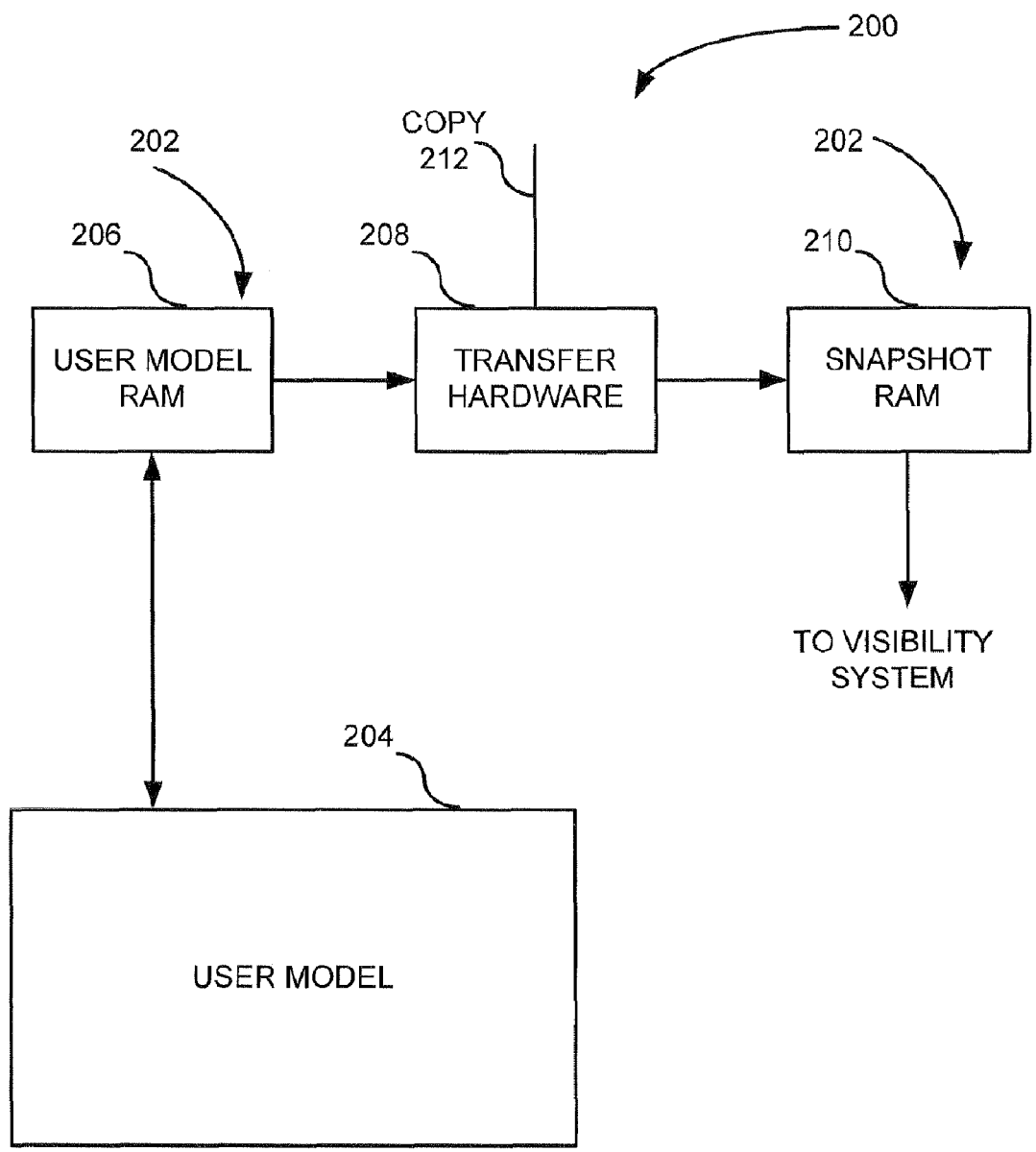
FIG. 8 is a hardware diagram showing the interrelationship between a user memory and snapshot memory.

FIG. 8 is a high-level diagram 200 showing the interaction between a RAM 202 located on one of the printed circuit boards 16, a user model 204 and the visibility system 40. The user model 204 represents the system being emulated in the hardware emulator 12 by the user. The user model 204 accesses RAM 202, which includes a user model portion 206, transfer hardware 208, and a snapshot portion 210. The user model portion 206 is directly readable and writeable by the user model 204. However, in order to not overburden the visibility system, the visibility system 40 accesses the user model portion 206 via the snapshot portion 210. At any desired moment in time, a copy signal line 212 coupled to the transfer hardware 208 can effectuate a block copy of the contents of the user model portion 206 of the RAM 202 to the snapshot portion 210. These contents can then be downloaded to the visibility system over many clock cycles and show the state of the user model portion 206 at substantially the moment of activation of the copy signal. The RAM 202 may be one integrated RAM or include several separate memories.

Figure 9:
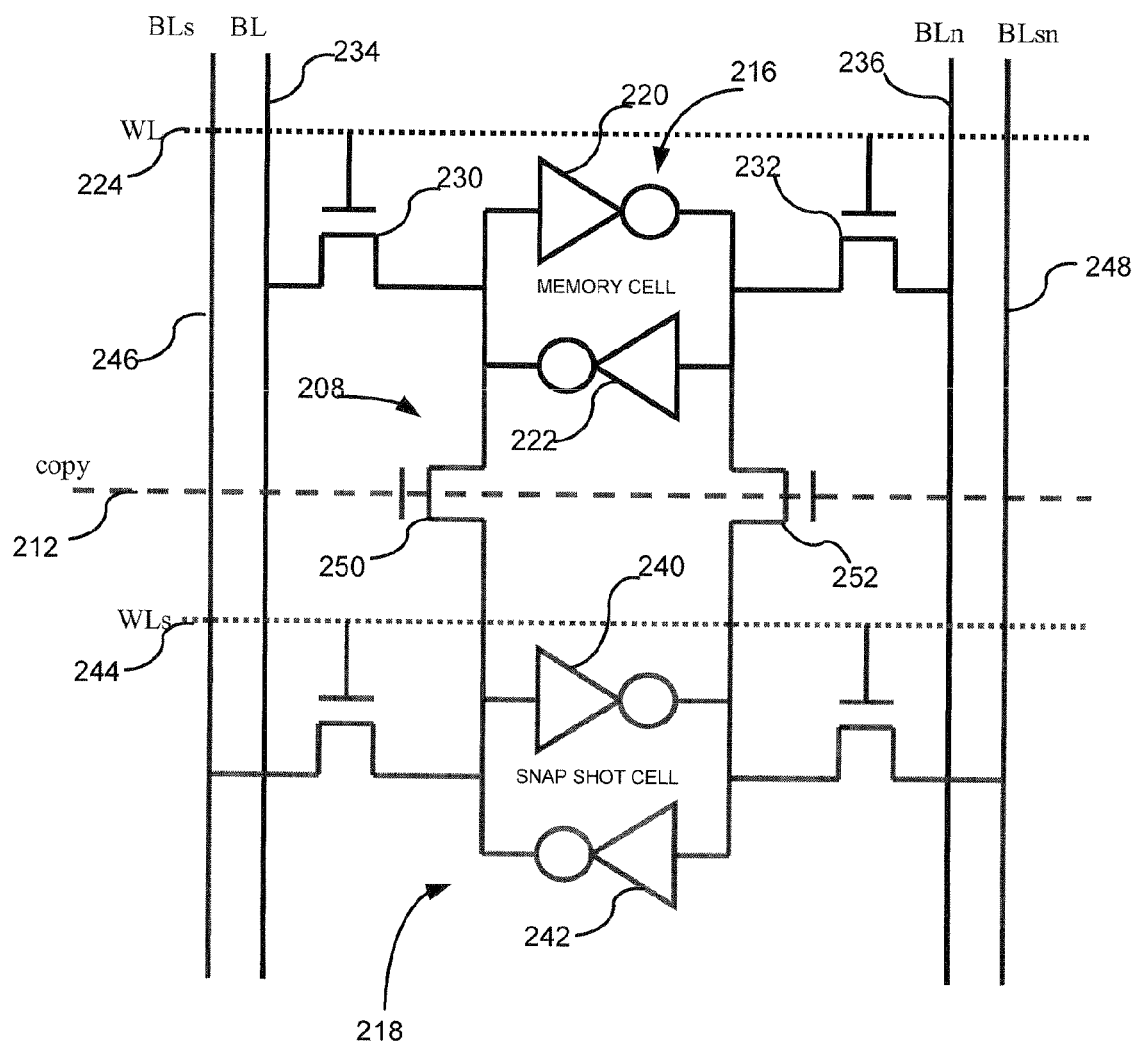
FIG. 9 is a particular hardware embodiment showing the user memory and snapshot memory at the bit level.

FIG. 9 shows an example of a user memory type cell 216 of the user model portion 206 and a snapshot memory type cell 218 of the snapshot portion 210 coupled together by transfer hardware 208. In this embodiment, memory cell 216 includes back-to-back inverters 220, 222 coupled together in a continuous loop. A first word line WL 224 allows data to be written to or read from memory cell 216 by switching on opposing transistors 230, 232 and allowing data to be driven from or received to bit lines BL 234 and BLn 236 (inverted BL). The word line WL 224 and bit lines BL 234, BLn 236 are accessible by the user model 204. The snapshot type memory cell 218 has a similar back-to-back inverter structure using inverters 240, 242. A second word line WLS 244 and separate bit lines 246, 248 allow access to the snapshot memory cell 218. The copy signal line 212 activates two transistors 250, 252 that form a switch and allow data to be copied from the user memory cell 216 to the snapshot memory cell 218. As described further below, there are many techniques to ensure that the data is copied from memory cell 216 to memory cell 218 and not vice versa. One technique is to ensure that user memory type cells are larger than snapshot type memory cells. By having separate word lines and separate bit lines, both memory cells 216, 218 can be operated independently of each other as they function as completely separate memories, although physically they are formed on the same silicon and located in the same chip. For example, the RAM may be used to perform a block copy of all the user memory-type memory cells to the snapshot-type memory cells within one emulator clock cycle. The snapshot-type memory cells may then be read at the same time that new data is being written to the user memory cells without either memory portion disturbing the operation of the other portion. Thus, the user memory-type memory cells represent the primary memory cells of the memory while the snapshot-type memory cells represent an instantaneous copy of the primary memory cells. The instantaneous copy may thereafter be passed to the visibility system over many clock cycles to not overburden the visibility system.

FIG. 10 shows another embodiment that may be used to transfer contents of a user model RAM 270 to a snapshot RAM 272 via transfer hardware 274. In this embodiment, a cache 276 is used to buffer memory accesses from the user model 278 while the contents of the user model RAM 270 is transferred to the snapshot RAM 272 in response to activation of a copy line 280. After the transfer is complete, the cache 276 is used to update the contents of the user model RAM 270.

Having illustrated and described the principles of the illustrated embodiments, it will be apparent to those skilled in the art that the embodiments can be modified in arrangement and detail without departing from such principles.

Although two embodiments are shown to transfer data from the user model portion of RAM to the snapshot RAM, there are numerous techniques for making such a transfer as well understood in the art, and any other technique may easily be substituted to perform such a transfer.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A method of tracing memory in a hardware emulator, comprising:
   identifying a first Random Access Memory, the first Random Access Memory having data associated with a user design during emulation and resulting from a plurality of write requests stored thereon;
   capturing a copy of the contents of the first Random Access Memory at a point in time in a separate second Random Access Memory; and
   copying the captured contents from the second Random Access Memory for the purpose of tracing memory, during which time the user design may modify the data in the first Random Access Memory while the captured contents within the second Random Access Memory remain unmodifiable.

2. The method of claim 1, wherein the capturing occurs in one clock cycle of the emulator.

3. The method of claim 1, wherein the capturing occurs without stopping emulation of the user design.

4. The method of claim 1, wherein the second memory is not accessible by the user design.

5. The method of claim 1, wherein the capturing includes copying the entire contents of the first memory to the second memory in response to activation of a copy signal line.

6. The method of claim 1, wherein copying the captured contents includes copying the entire contents of the second memory to a trace memory.

7. The method of claim 6, further including preventing any changes to the second memory and wherein copying includes copying predetermined blocks of data over multiple clock cycles to a visibility system until the contents of the second memory is copied.

8. The method of claim 1, further including receiving a user request to view the contents of the first Random Access Memory at a point in time and simulating the user design using the contents received from the second Random Access Memory to reconstruct the contents of the first Random Access Memory at the point in time.

9. The method of claim 1, wherein the first and second Random Access Memories have different physical addresses within the emulator, but are located within the same integrated circuit package.

10. A hardware emulator, comprising:
    a first Random Access Memory used to emulate a user design;
    a separate second Random Access Memory coupled to the first Random Access Memory,
    a copy signal line coupled to both the first Random Access Memory and the second Random Access Memory for copying the entire contents of the first memory to the second memory; and
    a visibility system coupled to the second Random Access Memory and not coupled to the first Random Access Memory, the visibility system allowing a user to view the contents of the first Random Access Memory.

11. The hardware emulator of claim 10, wherein the first Random Access Memory and the second Random Access Memory are located within the same integrated circuit.

12. The hardware emulator of claim 10, wherein the first Random Access Memory (RAM) is in a first group of RAMs used to emulate a user design, each RAM having a first size; further including:
    a second group of RAMs used to emulate a user design, each RAM in the second group being a size larger than the RAMs in the first group;
    the visibility system coupled to the ports of the second group of RAMs for monitoring the contents thereof.

13. The hardware emulator of claim 10, wherein the first Random Access Memory includes multiple memory cells and the second Random Access Memory includes multiple memory cells and each memory cell of the first Random Access Memory is individually coupled to a corresponding memory cell in the second Random Access Memory in a one-to-one correspondence.

14. The hardware emulator of claim 13, wherein each memory cell of the first Random Access Memory is coupled to a corresponding memory cell of the second Random Access Memory through a transistor coupled to a copy line.

15. The hardware emulator of claim 13, wherein a memory cell includes two inverters coupled in series.

16. The hardware emulator of claim 10, further including a cache coupled to the first Random Access Memory, the cache activated only during a copy from the first Random Access Memory to the second Random Access Memory.

17. A method of tracing memory in a hardware emulator, comprising:
    emulating a memory of a user design using a first emulator memory; and providing a separate second emulator memory used for visibility of the first emulator memory, the second emulator memory not always being a copy of the first memory during emulation, but at any point in time, an instantaneous copy is made to capture the entire first emulator memory contents in the second emulator memory.

18. The method of claim 17, wherein the instantaneous copy occurs in one emulation clock cycle.

19. The method of claim 17, further comprising downloading the contents of the second emulator memory to an emulator visibility system over many emulator clock cycles.

20. The method of claim 17, further including modifying the first emulator memory during emulation without modifying the second emulator memory.

* * * * *